United States Patent
Jung et al.

(10) Patent No.: US 12,108,648 B2
(45) Date of Patent: Oct. 1, 2024

(54) DISPLAY PANEL AND MANUFACTURING METHOD THEREOF

(71) Applicant: LG Display Co., Ltd., Seoul (KR)

(72) Inventors: Hangyu Jung, Paju-si (KR); Woojung Byun, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 348 days.

(21) Appl. No.: 17/546,674

(22) Filed: Dec. 9, 2021

(65) Prior Publication Data
US 2022/0208881 A1 Jun. 30, 2022

(30) Foreign Application Priority Data
Dec. 29, 2020 (KR) .................. 10-2020-0186711

(51) Int. Cl.
| | |
|---|---|
| *H10K 59/35* | (2023.01) |
| *G09G 3/3233* | (2016.01) |
| *H01L 27/12* | (2006.01) |
| *H10K 59/12* | (2023.01) |
| *H10K 59/121* | (2023.01) |

(52) U.S. Cl.
CPC ......... *H10K 59/353* (2023.02); *G09G 3/3233* (2013.01); *H10K 59/1213* (2023.02); *H10K 59/1216* (2023.02); *H10K 59/1201* (2023.02)

(58) Field of Classification Search
CPC ............. H10K 59/353; H10K 59/1213; H10K 59/1216; H10K 59/1201; G09G 3/3233
See application file for complete search history.

(56) References Cited

U.S. PATENT DOCUMENTS

| | | |
|---|---|---|
| 2011/0086450 A1 | 4/2011 | Nam et al. |
| 2012/0068185 A1* | 3/2012 | Kim ............... H10K 59/12 438/34 |
| 2016/0071888 A1 | 3/2016 | Park et al. |
| 2018/0267441 A1 | 9/2018 | Koyanagi et al. |
| 2018/0315805 A1* | 11/2018 | Liu ............... H10K 59/12 |
| 2019/0033674 A1* | 1/2019 | Ando ............ G02F 1/1368 |
| 2019/0326335 A1* | 10/2019 | Liu ............... H01L 27/127 |
| 2020/0066758 A1 | 2/2020 | Yang et al. |
| 2020/0135767 A1* | 4/2020 | Ge ............... H01L 29/66765 |
| 2021/0200008 A1* | 7/2021 | Morinaga ........ G02F 1/13394 |
| 2022/0216285 A1* | 7/2022 | Seo ............... H01L 29/41733 |
| 2023/0099934 A1* | 3/2023 | Gong ............. H01L 27/1248 |

FOREIGN PATENT DOCUMENTS

| | | |
|---|---|---|
| DE | 10 2012 108 165 A1 | 3/2013 |
| KR | 10-2013-0077439 A | 7/2013 |

* cited by examiner

*Primary Examiner* — Mohsen Ahmadi
(74) *Attorney, Agent, or Firm* — Birch, Stewart, Kolasch & Birch, LLP

(57) ABSTRACT

A display panel having an improved opening ratio and a manufacturing method of the display panel are discussed. In the display panel, a storage capacitor includes a bottom electrode, a buffer layer disposed on the bottom electrode, a middle electrode covering a portion of the buffer layer, a gate insulating layer covering the middle electrode and the buffer layer, and an upper electrode covering a portion of the gate insulating layer. In the buffer layer, a thickness of a first area covering the middle electrode is greater than a thickness of a second area that is in contact with the gate insulating layer.

6 Claims, 14 Drawing Sheets

DISPLAY PANEL AND MANUFACTURING METHOD THEREOF

CROSS REFERENCE TO RELATED APPLICATION

This application claims the priority benefit of Korean Patent Application No. 10-2020-0186711 filed in the Republic of Korea on Dec. 29, 2020, the entire contents of which are hereby expressly incorporated by reference for all purposes as if fully set forth herein into the present application.

BACKGROUND

Field

The present disclosure relates to a display panel and a manufacturing method thereof.

Description of the Related Art

An organic light emitting device (hereinafter, referred to as a light emitting device) constituting an organic light emitting display device emits light by itself and does not require a separate light source. Therefore, the thickness and weight of the organic light emitting display device can be reduced. Also, the organic light emitting display device shows high quality characteristics including low power consumption, high luminance, high response speed, etc.

In general, the light emitting device has a structure in which an anode electrode, a bank surrounding the edge portions of the anode electrode, an emission material layer formed on the anode electrode within the bank, and a cathode electrode covering the emission material layer and the bank are stacked.

The organic light emitting display device has two types of a light emitting method such as a front side type and a back side type. According to the back side type, display is performed in a direction of the anode electrode which faces the cathode electrode. The back side type has a structure in which a pixel circuit which drives the light emitting device is placed before the anode electrode, that is, a light emitting part, and blocks light from the light emitting part. For this reason, it is particularly relevant to secure an opening ratio.

SUMMARY OF THE DISCLOSURE

One purpose of the present disclosure is to provide a display panel having an improved opening ratio.

Another purpose of the present disclosure is to provide a display panel and a method of forming the display panel, which address the limitations and disadvantages associated with the related art.

The present disclosure can have the following embodiments.

One embodiment is a manufacturing method of a display panel including a light emitting device and a pixel circuit which drives the light emitting device. The manufacturing method includes forming the pixel circuit on a substrate, and forming the light emitting device on the pixel circuit. The forming the pixel circuit includes forming a first electrode layer on the substrate, forming a buffer layer on the first electrode layer, and forming an active layer on the buffer layer. The forming the active layer includes depositing a first active layer and depositing a second active layer on the first active layer; a first patterning step of applying a photoresist material on the second active layer, forming a photoresist pattern through a halftone mask, and first etching the second active layer; a halftone ashing step of exposing a portion of the first pattern second active layer; and a second patterning step of etching the first active layer.

In the second patterning step, the etching is excessively performed so that a portion of the buffer layer disposed under the first active layer is etched together.

The forming the active layer further includes a third patterning step of additionally etching the second active layer.

The third patterning step includes wet etching. The first patterning step includes dry etching. The second patterning step includes wet etching.

The first active layer is composed of indium gallium zinc oxide (IGZO), and the second active layer is made of molybdenum titanium (MoTi).

Another embodiment is a display panel in which a plurality of sub-pixels are arranged in the form of a matrix. The sub-pixel includes a light emitting device, a driving transistor which supplies a driving current to the light emitting device, and a storage capacitor which maintains, for a certain period of time, a voltage controlling a magnitude of the driving current. The storage capacitor includes a bottom electrode, a buffer layer disposed on the bottom electrode, a middle electrode covering a portion of the buffer layer, a gate insulating layer covering the middle electrode and the buffer layer, and an upper electrode covering a portion of the gate insulating layer. In the buffer layer, a thickness of a first area covered by the middle electrode is greater than a thickness of a second area that is in contact with the gate insulating layer.

The middle electrode is composed of a double layer. The middle electrode includes a first active layer composed of indium gallium zinc oxide (IGZO), and a second active layer made of molybdenum titanium (MoTi).

The middle electrode is connected to a gate electrode of the driving transistor, and the bottom electrode and the upper electrode are connected to an anode electrode of the light emitting device.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
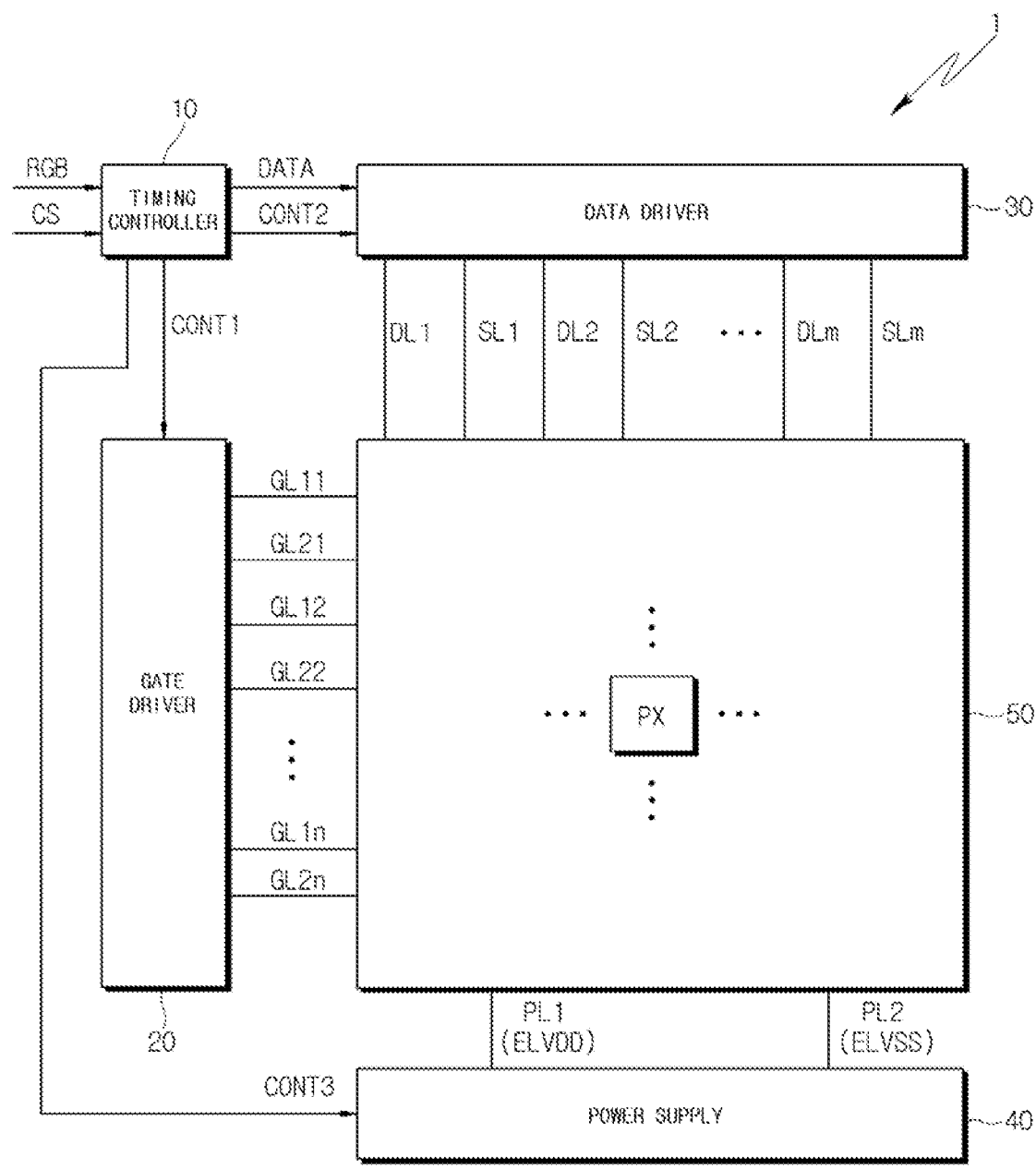
FIG. 1 is a block diagram showing a configuration of a display device according to an embodiment of the present disclosure.

The features, advantages and method for accomplishment of the present invention will be more apparent from referring to the following detailed embodiments described as well as the accompanying drawings. However, the present invention is not limited to the embodiments to be disclosed below and is implemented in different and various forms. The embodiments bring about the complete disclosure of the present invention and are only provided to make those skilled in the art fully understand the scope of the present invention. The present invention is just defined by the scope of the appended claims.

Since the shapes, sizes, proportions, angles, numbers, etc., disclosed in the drawings for describing the embodiments of the present invention are illustrative, the present invention is not limited to the shown details. The same reference numerals throughout the disclosure correspond to the same elements. Also, throughout the description of the present invention, the detailed description of known technologies incorporated herein will be omitted when it may make the subject matter of the present invention unclear. Terms such as "includes", "has", "composed", etc., mentioned in the present disclosure are used, other parts can be added unless a term "only" is used. A component represented in a singular form includes the expression of plural form thereof unless otherwise explicitly mentioned.

In construing components, error ranges are construed as being included even unless otherwise explicitly mentioned.

In describing positional relationships, when the positional relationship of two parts is described, for example, "on", "over", "under", "next to", etc., one or more other parts can be positioned between the two parts as long as a term "directly" or "immediately" is not used.

While terms such as the first and the second, etc., can be used to describe various components, the components are not limited by the terms mentioned above. The terms are used only for distinguishing between one component and other components. Therefore, the first component to be described below can be the second component within the spirit of the present invention.

The same reference numerals throughout the disclosure correspond to the same elements.

In one embodiment of the present invention, a pixel circuit formed on a substrate of a display panel can be implemented as a thin film transistor (TFT) having an n-type or p-type metal oxide semiconductor field effect transistor (MOSFET) structure. The TFT is a three-electrode device which includes a gate, a source and a drain. The source is an electrode which supplies a carrier to the transistor. Within the TFT, carriers start flowing from the source. The drain is an electrode through which carriers exit the TFT. That is, the carriers flow from the source to the drain in the MOSFET. In the case of an n-type TFT (NMOS), since the carrier is an electron, a source voltage is lower than a drain voltage such that electrons are able to flow from the source to the drain. In the n-type TFT, since electrons flow from the source to the drain, the current flows from the drain to the source. In the case of a p-type TFT (PMOS), since the carrier is a hole, the source voltage is higher than the drain voltage such that holes are able to flow from the source to the drain. In the p-type TFT, since the holes flow from the source to the drain, the current flows from the source to the drain. It should be noted that the source and drain of the MOSFET are not fixed. For example, the source and drain of the MOSFET can be changed according to an applied voltage.

Hereinafter, a gate-on voltage is a voltage of a gate signal at which the TFT can be turned on. A gate-off voltage is a voltage at which the TFT can be turned off. In the PMOS, the gate-on voltage is a gate low voltage VGL, and the gate-off voltage is a gate high voltage VGH. In the NMOS, the gate-on voltage is the VGH and the gate-off voltage is the VGL.

Hereinafter, various embodiments of the present invention will be described in detail with reference to the accompanying drawings. The component names used in the following description are selected in consideration of making it easier to write the specification and can be different from the component names of an actual product.

FIG. 1 is a block diagram showing a configuration of a display device according to an embodiment of the present disclosure. All the components of each display device according to all embodiments of the present disclosure are operatively coupled and configured.

Referring to FIG. 1, a display device 1 includes a timing controller 10, a gate driver 20, a data driver 30, a power supply 40, and a display panel 50.

The timing controller 10 can receive an image signal RGB and a control signal CS from the outside. The image signal RGB can include a plurality of gradation data. The control signal CS can include, for example, a horizontal synchronization signal, a vertical synchronization signal, and a main clock signal.

The timing controller 10 can process the image signal RGB and the control signal CS appropriately for operating conditions of the display panel 50 to generate and output an image data DATA, a gate driving control signal CONT1, and a data driving control signal CONT2, and a power supply control signal CONT3.

The gate driver 20 can be connected to pixels (or sub-pixels, PX) of the display panel 50 through a plurality of first gate lines GL11 to GL1n, where n can be a natural number such as a positive integer. The gate driver 20 can generate the gate signals on the basis of the gate driving control signal CONT1 output from the timing controller 10. The gate driver 20 can provide the generated gate signals to the pixels PX through the plurality of first gate lines GL11 to GL1n.

In various embodiments, the gate driver 20 can be further connected to the pixels PX of the display panel 50 through a plurality of second gate lines GL21 to GL2n. The gate driver 20 can provide a sensing signal to the pixels PX through the plurality of second gate lines GL21 to GL2n. The sensing signal can be supplied to measure characteristics of a driving transistor and/or a light emitting device provided within the pixels PX.

The data driver 30 can be connected to the pixels PX of the display panel 50 through a plurality of data lines DL1 to DLm. The data driver 30 can generate data signals on the basis of the data driving control signal CONT2 and the image data DATA output from the timing controller 10. The data driver 30 can provide the generated data signals to the pixels PX through the plurality of data lines DL1 to DLm, where m can be a natural number such as a positive integer.

In various embodiments, the data driver 30 can be further connected to the pixels PX of the display panel 50 through a plurality of sensing lines (or reference lines) SL1 to SLm. The data driver 30 can provide a reference voltage (or a sensing voltage, an initialization voltage) to the pixels PX through the plurality of sensing lines SL1 to SLm, or can sense the states of the pixels PX on the basis of an electrical signal fed back from the pixels PX.

The power supply 40 can be connected to the pixels PX of the display panel 50 through a plurality of power lines PL1 and PL2. The power supply 40 can generate a driving voltage to be supplied to the display panel 50 on the basis of the power supply control signal CONT3. The driving voltage can include, for example, a high potential driving voltage ELVDD and a low potential driving voltage ELVSS. The power supply 40 can provide the generated driving voltages ELVDD and ELVSS to the pixels PX through the corresponding power lines PL1 and PL2.

A plurality of the pixels PX (or referred to as sub-pixels) are disposed in the display panel 50. The pixels PX can be arranged, for example, on the display panel 50 in the form of a matrix.

Each pixel PX can be electrically connected to the gate line and the data line which correspond thereto. Such pixels PX can emit light with a luminance which corresponds to the gate signal and the data signal which are provided through the first gate lines GL11 to GL1n and the data lines DL1 to DLm.

Each pixel PX can represent any one of a first to third colors. In the embodiment, each pixel PX can represent any one of red, green, and blue colors. In another embodiment, each pixel PX can represent any one of cyan, magenta and yellow colors. In various embodiments, the pixels PX can represent any one of four or more colors. For instance, each pixel PX can represent any one of red, green, blue, and white colors.

The timing controller 10, the gate driver 20, the data driver 30, and the power supply 40 can be configured as a separate integrated circuit (IC) respectively or can be configured as an IC in which at least some of them are integrated. For example, at least one of the data driver 30 and the power supply 40 can be configured as an IC integrated with the timing controller 10.

Also, while the gate driver 20 and the data driver 30 are shown in FIG. 1 as separate components from the display panel 50, at least one of the gate driver 20 and the data driver 30 can be implemented in an in-panel method where it is formed integrally with the display panel 50. For example, the gate driver 20 can be formed integrally with the display panel 50 in a gate-in-panel (GIP) method.

Figure 2:
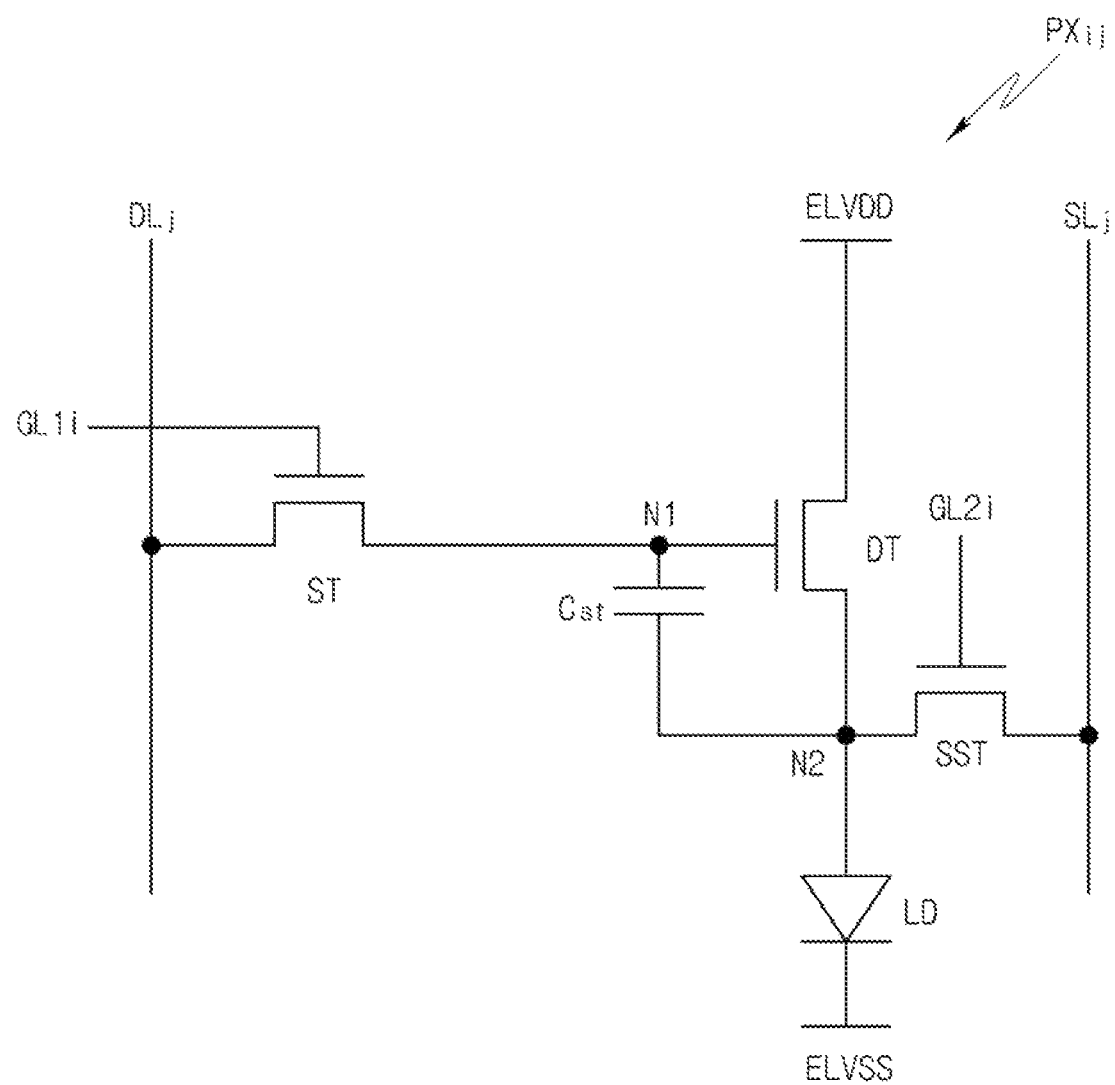
FIG. 2 is a circuit diagram showing an example of a pixel shown in FIG. 1.

FIG. 2 is a circuit diagram showing an example of a pixel shown in FIG. 1. FIG. 2 shows a pixel PXij connected to an i-th first gate line GL1i and a j-th data line DLj as an example and each pixel PX can have this this configuration. Here, I and j can be natural numbers such as positive integers.

Referring to FIG. 2. the pixel PX includes a switching transistor ST, a driving transistor DT, a sensing transistor SST, a storage capacitor Cst, and a light emitting device LD.

A first electrode (e.g., a source electrode) of the switching transistor ST is electrically connected to a j-th data line DLj, and a second electrode (e.g., a drain electrode) of the switching transistor ST is electrically connected to a first node N1. A gate electrode of the switching transistor ST is electrically connected to the i-th first gate line GL1i. When a gate signal of a gate-on level is applied to the i-th first gate line GL1i, the switching transistor ST is turned on and transmits the data signal applied to the j-th data line DLj to the first node N1.

A first electrode of the storage capacitor Cst is electrically connected to the first node N1, and a second electrode of the storage capacitor Cst is electrically connected to a second node N2. The storage capacitor Cst can charge a voltage corresponding to a difference between a voltage applied to the first node N1 and a voltage applied to the second node N2.

A first electrode (e.g., a drain electrode) of the driving transistor DT is configured to receive the high potential driving voltage ELVDD, and a second electrode (e.g., a source electrode) of the driving transistor DT is electrically connected to a first electrode (e.g., an anode electrode) of the light emitting device LD. The gate electrode of the driving transistor DT is electrically connected to the first node N1. When a voltage of the gate-on level is applied through the first node N1, the driving transistor DT can be turned on and can control the amount of a driving current flowing through the light emitting device LD in correspondence to a voltage provided to the gate electrode, that is, a voltage stored in the storage capacitor Cst. The storage capacitor Cst may maintain, for a certain period of time, a voltage controlling a magnitude of the driving current.

A first electrode (e.g., a drain electrode) of the sensing transistor SST is electrically connected to a j-th sensing line SLj, and a second electrode (e.g., the source electrode) of the sensing transistor SST is electrically connected to the first electrode (e.g., an anode electrode) of the light emitting device LD. A gate electrode of the sensing transistor SST is electrically connected to an i-th second gate line GL2i. When a sensing signal of the gate-on level is applied to the i-th second gate line GL2i, the sensing transistor SST is turned on and transmits the reference voltage applied to the j-th sensing line SLj to the anode electrode of the light emitting device LD.

The light emitting device LD outputs light corresponding to the driving current. The light emitting device LD can output light corresponding to any one of red, green, and blue colors. The light emitting device LD can be an organic light emitting diode (OLED) or a micro inorganic light emitting diode having a size in a range from micro scale to nano scale. However, the present invention is not limited thereto. Hereinafter, embodiments in which the light emitting device LD is composed of the organic light emitting diode will be described.

In the present invention, the structure of the pixels PX is not limited to what is shown in FIG. 2. According to the embodiment, the pixels PX can further at least one element for compensating a threshold voltage of the driving transistor DT or for initializing the voltage of the gate electrode of the driving transistor DT and/or the voltage of the anode electrode of the light emitting device LD.

FIG. 2 shows an example in which the switching transistor ST, the driving transistor DT, and the sensing transistor SST are NMOS transistors. However, the present invention is not limited thereto. For example, at least some or all of the transistors constituting each pixel PX can be composed of a PMOS transistor. In the NMOS transistor and the PMOS transistor in the circuit symbol, the source electrode and the drain electrode are positioned opposite to each other.

In various embodiments, the switching transistor ST, the driving transistor DT and the sensing transistor SST can be respectively implemented by a low temperature polysilicon (LTPS) thin film transistor, an oxide thin film transistor, or a low temperature polycrystalline oxide (LTPO) thin film transistor.

Figure 3A:
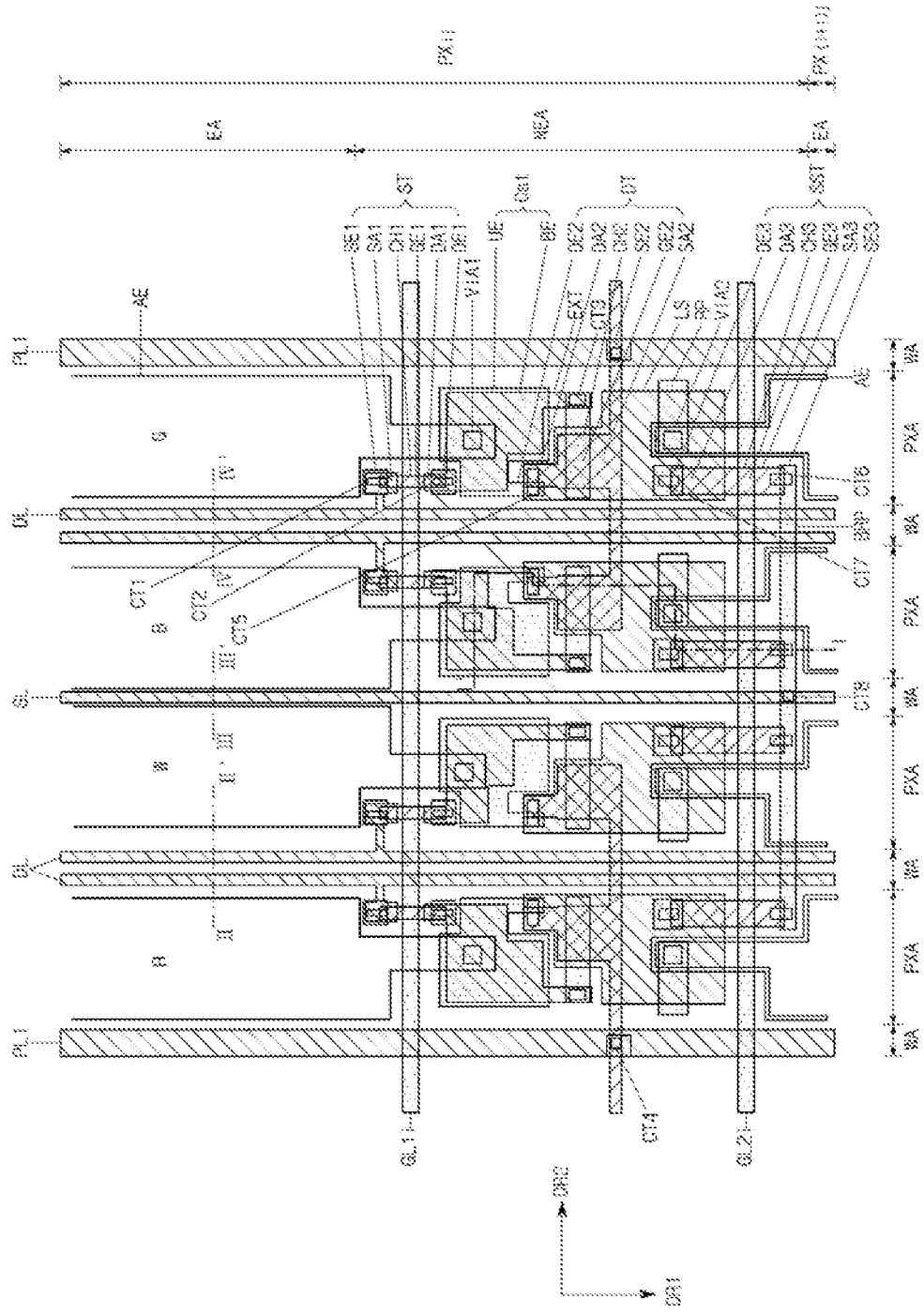
FIGS. 3A and 3B show a plan layout of the pixel according to the embodiment.
Figure 3B:
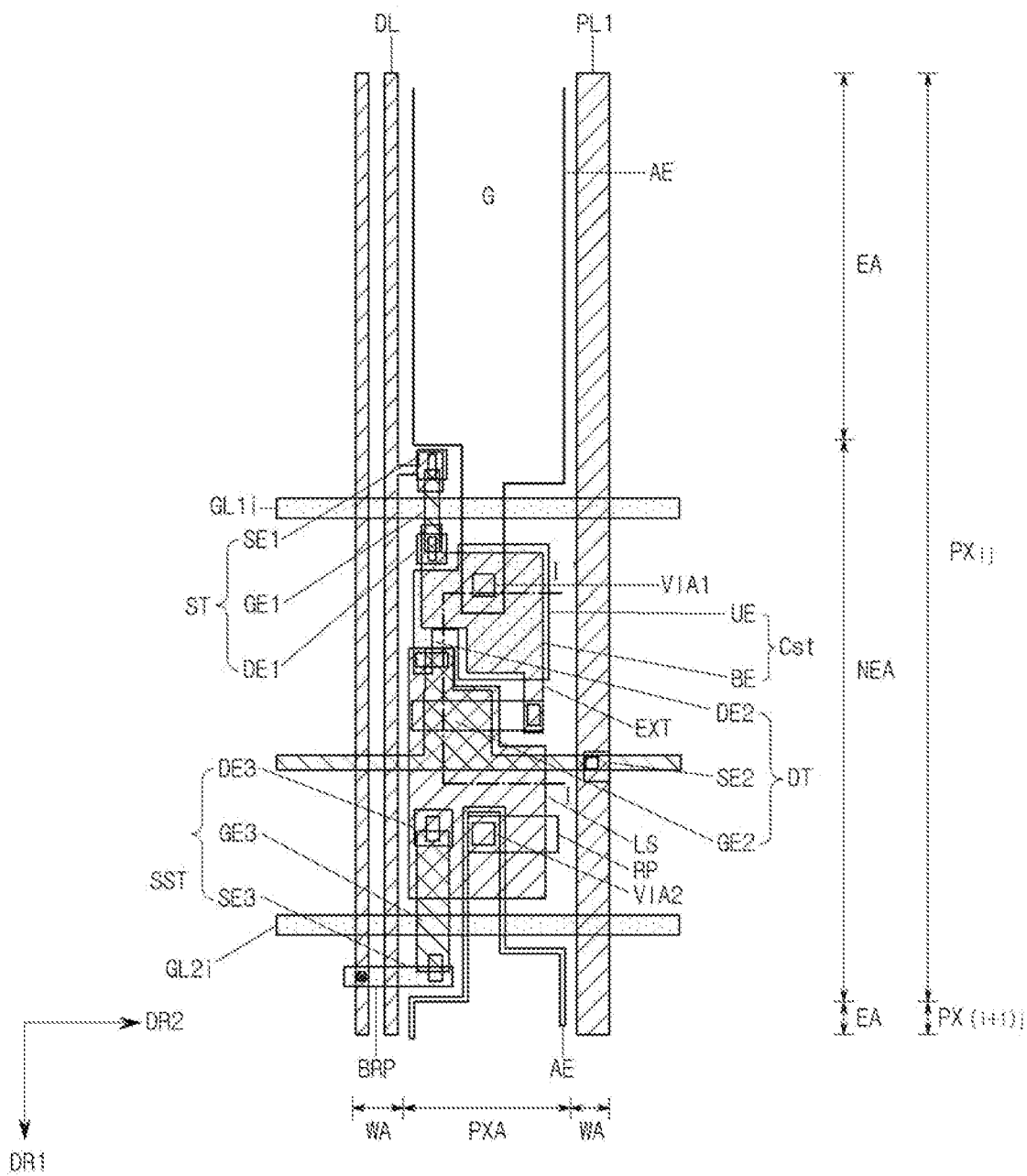

FIGS. 3A and 3B show a plan layout of the pixel according to the embodiment of the present disclosure.

Referring to FIGS. 2, 3A, and 3B together, the display panel 50 includes pixel areas PXA defined in an intersection area of the data lines DL extending in a first direction (e.g., a pixel column direction, DR1) and the first and second gate lines GL1 and GL2 extending in a second direction (e.g., a pixel row direction, DR2). The pixels PX are disposed in the pixel areas PXA respectively.

Each pixel area PXA can include a light emitting area EA in which the light emitting device LD of the pixel PX is disposed and can include a non-emitting area NEA in which circuit elements (e.g., a switching transistor ST, the driving transistor DT, the sensing transistor SST, and the storage capacitor Cst) for driving the light emitting device LD are disposed. The light emitting device LD can be driven by the circuit elements disposed in the non-emitting area NEA and can emit light having a specific color. The pixel area PXA can include an opening area which allows light from the light emitting device LD to transmit therethrough and displays an image to the outside. The opening area can be formed to correspond to the pixel PX which represents any one of red, green, blue, and white colors.

Wiring areas WA can be defined between pixel columns. The data line DL and the sensing line SL which extend in the first direction DR1 are disposed in each wiring area WA. The data line DL can receive a data signal from the data driver 30. The sensing line SL can receive a reference voltage from the data driver 30 or can transmit an electrical signal output from the corresponding pixel PX to the data driver 30.

In the embodiment, a first power line PL1 for applying the high potential driving voltage ELVDD to the pixels PX can be further formed in a portion of the wiring areas WA. The first power line PL1 can extend in the first direction DR1 generally parallel to the data line DL and the sensing line SL.

The first gate line GL1 and the second gate line GL2 extend across the non-emitting area NEA in the second direction DR2. In this case, the first gate line GL1 and the second gate line GL2 can be arranged at a regular interval along the first direction DR1.

The data line DL, the sensing line SL, the first power line PL1, the first gate line GL1, and the second gate line GL2 are electrically connected to the circuit elements through contact holes. Specifically, the data line DL can be electrically connected to one electrode (e.g., a drain electrode) of the switching transistor ST, and the sensing line SL can be electrically connected to one electrode (e.g., a drain electrode) of the sensing transistor SST. The first gate line GL1 is electrically connected to the gate electrodes of the switching transistor ST, and the second gate line GL2 is electrically connected to the gate electrode of the sensing transistor SST.

As described with reference to FIG. 2. the pixel PX can include the switching transistor ST, the driving transistor DT, the sensing transistor SST, the storage capacitor Cst, and the light emitting device LD.

The switching transistor ST can include a first gate electrode GE1, a first source electrode SE1, and a first drain electrode DE1.

The first gate electrode GE1 can be disposed to overlap a first channel CH1 formed in an active layer. The first channel CH1 can be a semiconductor pattern in which impurities are not doped in the active layer. The first gate electrode GE1 can be electrically connected to the first gate line GL1. For example, the first gate electrode GE1 can be a region overlapping the first channel CH1 on the first gate line GL1.

The first source electrode SE1 can be connected to a first source area SA1 formed on one side of the first channel CH1 of the active layer. The first source electrode SE1 can be further connected to the data line DL through a first contact hole CT1.

The first drain electrode DE1 can be connected to a first drain area DA1 formed on the other side of the first channel CH1 of the active layer. The first drain electrode DE1 can be electrically connected to a bottom electrode BE of the storage capacitor Cst through a second contact hole CT2.

The driving transistor DT can include a second gate electrode GE2, a second source electrode SE2, and a second drain electrode DE2.

The second gate electrode GE2 can be disposed to overlap a second channel CH2 formed in the active layer. The second gate electrode GE2 can be electrically connected to the bottom electrode BE of the storage capacitor Cst through a third contact hole CT3.

The second source electrode SE2 can be connected to a second source area SA2 formed on one side of the second channel CH2 of the active layer. The second source electrode SE2 can be electrically connected, through a fourth contact hole CT4, to the first power line PL1 to which the high potential driving voltage ELVDD is applied. In the embodiment, the second source electrode SE2 can be composed of a conductive pattern substantially provided in the wiring area WA. The second source electrode SE2 can be electrically connected to an upper electrode UE of the storage capacitor Cst. For example, the second source electrode SE2 can be integrally formed with the upper electrode UE of the storage capacitor Cst to constitute one pattern. As will be described later, since the upper electrode UE of the storage capacitor Cst is connected to the anode electrode AE of the light emitting device LD through a first via hole VIA1, the second source electrode SE2 of the driving transistor DT is electrically connected to the anode electrode AE of the light emitting device LD via the upper electrode UE of the storage capacitor Cst.

The second drain electrode DE2 can be connected to a second drain region DA2 formed on the other side of the second channel CH2 of the active layer.

Also, the second drain electrode DE2 can be connected to a light shielding layer LS through a fifth contact hole CT5. Through this, when defects in the pixel PX are repaired by using a repair pattern RP, the repair pattern RP and the light shielding layer LS are connected through laser welding, so that the anode electrode AE of an adjacent pixel PX (i+1)j and the second drain electrode DE2 of the driving transistor DT can be electrically connected.

The sensing transistor SST can include a third gate electrode GE3, a third source electrode SE3, and a third drain electrode DE3.

The third gate electrode GE3 can be disposed to overlap a third channel CH3 formed in the active layer. The third gate electrode GE3 can be electrically connected to the second gate line GL2. For example, the third gate electrode GE3 can be a region overlapping the third channel CH3 on the second gate line GL2.

The third source electrode SE3 can be connected to a third source area SA3 formed on one side of the third channel CH3 of the active layer. The third source electrode SE3 can be electrically connected to a bridge pattern BRP through a sixth contact hole CT6. The bridge pattern BRP is electrically connected to the sensing line SL through an eighth contact hole CT8. Accordingly, the third source electrode SE3 can be electrically connected to the sensing line SL via the bridge pattern BRP.

The third drain electrode DE3 can be connected to a third drain region DA3 formed on the other side of the third channel CH3 of the active layer. Also, the third drain electrode DE3 can be connected to the light shielding layer LS through a seventh contact hole CT7. In the embodiment, since the light shielding layer LS is connected to the second drain electrode DE2 of the driving transistor DT through the fifth contact hole CT5, the third drain electrode DE3 is electrically connected to the second drain electrode DE2 of the driving transistor DT via the light shielding layer LS.

The storage capacitor Cst can include the bottom electrode BE and the upper electrode UE.

The bottom electrode BE can be electrically connected to the first drain electrode DE1 of the switching transistor ST through the second contact hole CT2. Also, the bottom electrode BE can be electrically connected to the second gate electrode GE2 of the driving transistor DT through the third contact hole CT3.

In the embodiment, the bottom electrode BE can include an extension part EXT for the bottom electrode BE to be connected to the second gate electrode GE2 of the driving transistor DT. In one region of the extension part EXT, the bottom electrode BE overlaps the second gate electrode GE2 and is electrically connected to the second gate electrode GE2 through the third contact hole CT3.

The upper electrode UE is formed such that at least one region of the upper electrode UE is formed to cover the bottom electrode BE. Since charges corresponding to a potential difference between the upper electrode UE and the bottom electrode BE are stored between the two electrodes, the upper electrode UE and the bottom electrode BE can operate as the storage capacitor Cst.

The capacity of the storage capacitor Cst can be determined depending on an area where the upper electrode UE and the bottom electrode BE overlap. Accordingly, the upper electrode UE and the bottom electrode BE can have an area (size) to satisfy the required capacity of the storage capacitor Cst.

The upper electrode UE can be electrically connected to the second drain electrode DE2 of the driving transistor DT through the fifth contact hole CT5. Also, the upper electrode UE can be electrically connected to the anode electrode AE of the light emitting device LD through the first via hole VIA1.

The above-mentioned storage capacitor Cst is connected to the second gate electrode GE2 of the driving transistor DT through the bottom electrode BE. A below-described cathode electrode CE of the light emitting device LD can be formed on the driving transistor DT. In this case, an electric field can be formed between the cathode electrode CE and the second gate electrode GE2 of the driving transistor DT. This can reduce the charging rate of the storage capacitor Cst electrically connected to the second gate electrode GE2. In other words, a parasitic capacitor can be formed which has the second gate electrode GE2 as one electrode thereof and the cathode electrode CE as the other electrode thereof. As described in the embodiment, when the second gate electrode GE2 is electrically connected to the bottom electrode BE instead of the upper electrode UE of the storage capacitor Cst, an electrical path from the parasitic capacitor to the storage capacitor Cst becomes relatively longer, so that the effect of the parasitic capacitor can be reduced. Also, since the bottom electrode BE of the storage capacitor Cst is formed on the substrate of the display panel 50, an electric field between the second gate electrode GE2 and the cathode electrode CE is prevented from being formed, thereby removing the parasitic capacitor.

The light emitting device LD can include the anode electrode AE, the cathode electrode CE, and an emission material layer EML disposed between the anode electrode AE and the cathode electrode CE. In the embodiment, the anode electrode AE, the emission material layer EML, and the cathode electrode CE can be disposed in direct contact in the light emitting area EA.

The anode electrode AE can be connected to the upper electrode UE of the storage capacitor Cst through the first via hole VIA1. A bank layer, the emission material layer EML, and the cathode electrode CE can be disposed on the anode electrode AE in the below-described non-emitting area NEA. The anode electrode AE is generally formed in the light emitting area EA. However, at least one region of the anode electrode AE can extend to the non-emitting area NEA in order that the anode electrode AE contacts the upper electrode UE of the storage capacitor Cst.

The emission material layer EML and the cathode electrode CE are widely formed in the light emitting area EA and the non-emitting area NEA. Here, the emission material layer EML covers the anode electrode AE.

In the embodiment, the pixel PX can further include the repair pattern RP. One area of the repair pattern RP is disposed not to overlap the anode electrode AE of an adjacent pixel PX(i+1)j and to overlap the light shielding layer LS.

In this case, the repair pattern RP is electrically connected to the anode electrode AE of the adjacent pixel PX(i+1)j through a second via hole VIA2 in an area other than the one area. In order to be electrically connected to the anode electrode AE of the adjacent pixel PX(i+1)j, the repair pattern RP can be disposed close to the anode electrode AE of the adjacent pixel PX(i+1)j in the non-emitting area NEA.

Since the repair pattern RP is disposed close to the anode electrode AE of the adjacent pixel PX(i+1)j in the non-emitting area NEA, the light shielding layer LS which is disposed to overlap the repair pattern RP in the one area can have a wide area extending from a portion overlapping the driving transistor DT to the one area.

The repair pattern RP can be an island-shaped electrode having a bar shape extending generally in the second direction DR2. However, the shape of the repair pattern RP is not limited thereto, and can be variously changed according to the relative arrangement of other components including the light shielding layer LS and the anode electrode AE.

FIGS. 3A and 3A show, as an example, the display device 1 has a WRGB structure including a white pixel W. However, the above embodiments are not applied only to the display device 1 having the WRGB structure. That is, various features that are not related to the white pixel W in the above embodiments can be applied to display devices having an RGB structure or an RGBG structure which does not include the white pixel W. Also, various features related to the white pixel W in the above embodiments can be applied not only to the display device 1 having a WRGB structure but also to display devices having various structures including the white pixel W.

Hereinafter, a stacked structure (cross-sectional structure) of the pixel PX according to the embodiment will be described in more detail with reference to the drawings.

Figure 4:
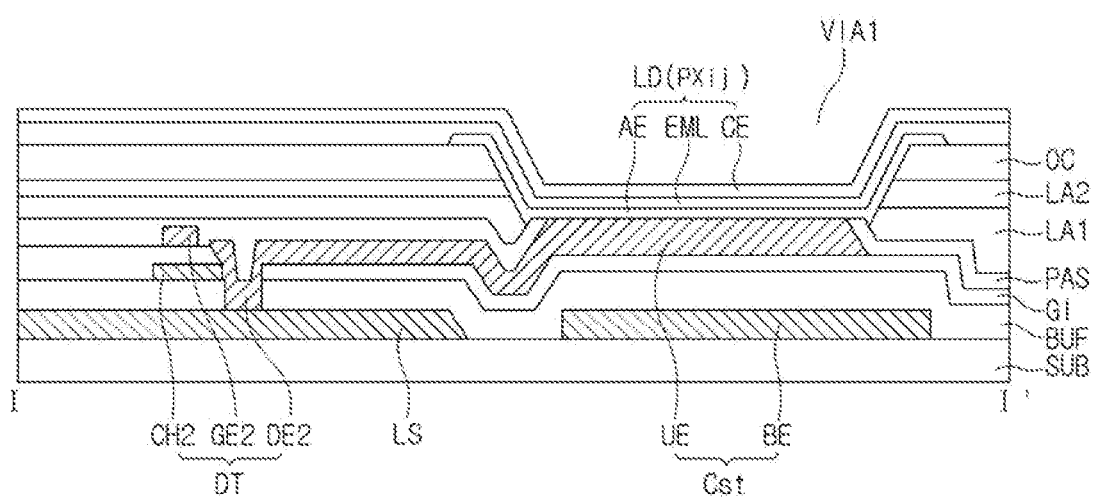
FIG. 4 is a cross sectional view of the pixel according to the embodiment, and specifically, is a cross sectional view taken along line I-I' of FIG. 3B.

FIG. 4 is a cross sectional view of the pixel according to the embodiment, and specifically, is a cross sectional view taken along line I-I' of FIG. 3B.

Referring to FIG. 4 together with FIGS. 3A and 3B, the display panel 50 can include a substrate SUB, a pixel circuit layer, and a light emitting device layer.

The substrate SUB is a base material of the display panel 50 and can be a light-transmitting substrate. The substrate SUB can be a rigid substrate including glass or tempered glass or a flexible substrate made of plastic. For example, the substrate SUB can be formed of a plastic material such as polyimide, polyethylene terephthalate (PET), polyethylene naphthalate (PEN), or polycarbonate (PC), etc. However, the material of the substrate SUB is not limited thereto.

The pixel area PXA is defined on the substrate SUB. The pixel area PXA can be defined as an area which includes at least one circuit element disposed on the pixel circuit layer and the light emitting device LD disposed on the light emitting device layer. The at least one circuit element and the light emitting element LD can constitute one pixel PX.

The pixel circuit layer is formed on the substrate SUB, and can include circuit elements constituting the pixel PX (e.g., the switching transistor ST, the driving transistor DT, the sensing transistor SST, and the storage capacitor Cst, etc.) and wirings.

First, a first electrode layer can be disposed on the substrate SUB. The first electrode layer can include the light shielding layer LS and the bottom electrode BE of the storage capacitor Cst.

The light shielding layer LS can be disposed to overlap a semiconductor pattern of the driving transistor DT, in particular, the second channel CH2 on a plane and can protect the oxide semiconductor device from external light. In the embodiment, the light shielding layer LS can be further connected to the second drain electrode DE2 of the driving transistor DT through the fifth contact hole CT5. Through this, when defects in the pixel PX are repaired by using a repair pattern RP, the repair pattern RP and the light shielding layer LS are connected through laser welding, so that the anode electrode AE of an adjacent pixel PX (i+1)j and the second drain electrode DE2 of the driving transistor DT can be electrically connected.

The bottom electrode BE can be electrically connected to the first drain electrode DE1 of the switching transistor ST through the second contact hole CT2. Also, the bottom electrode BE can be electrically connected to the second gate electrode GE2 of the driving transistor DT through the third contact hole CT3.

In the embodiment, the bottom electrode BE can include the extension part EXT for the bottom electrode BE to be connected to the second gate electrode GE2 of the driving transistor DT. In one region of the extension part EXT, the bottom electrode BE overlaps the second gate electrode GE2 and is electrically connected to the second gate electrode GE2 through the third contact hole CT3. Another region of the extension EXT is disposed not to overlap other electrodes of the circuit elements and the anode electrode AE of the light emitting element LD. Through this, when the second gate electrode GE2 and the anode electrode AE are electrically separated by cutting the extension part EXT with a laser and defects in the pixel PX are repaired, it is possible to prevent an electrical short-circuit between other electrodes and/or between the anode electrode AE and the cathode electrode CE of the light emitting device LD.

In the wiring area WA, the first electrode layer can further include the data line DL, the sensing line SL, and the first power line PL1. The data line DLj is connected to the first source electrode SE1 of the switching transistor ST through the first contact hole CT1. The sensing line SL is connected to the third source electrode SE3 of the sensing transistor SST via the bridge pattern BRP. The first power line PL1 is connected to the second source electrode SE2 of the driving transistor DT through the fourth contact hole CT4.

In various embodiments, wiring and/or electrodes, for example, a second power line PL2 applying the low potential driving voltage ELVSS, and an auxiliary electrode, can be further provided on the substrate SUB.

A buffer layer BUF is disposed on the substrate SUB and covers the light shielding layer LS, the bottom electrode BE of the storage capacitor Cst, and the wirings. The buffer layer BUF can prevent ions or impurities from diffusing from the substrate SUB and can block moisture from permeating. Also, the buffer layer BUF can improve the surface flatness of the substrate SUB. The buffer layer BUF can include inorganic matter such as oxide, nitride, etc., organic matter, or organic/inorganic composite, and can be formed as a single layer or multiple layers. For example, the buffer layer BUF can have a structure of three or more layers made of silicon oxide, silicon nitride, and silicon oxide. In another embodiment, the buffer layer BUF can be omitted.

The active layer can be formed on the buffer layer BUF. The active layer can be formed of a silicon-based semiconductor material or an oxide-based semiconductor material. Amorphous silicon or polycrystalline silicon can be used as the silicon-based semiconductor material. The oxide-based semiconductor material can include quaternary metal oxide such as indium tin gallium zinc oxide (InSnGaZnO), ternary metal oxide such as indium gallium zinc oxide (InGaZnO), indium tin zinc oxide (InSnZnO), indium aluminum zinc oxide (InAlZnO), tin gallium zinc oxide (SnGaZnO), aluminum gallium zinc oxide (AlGaZnO), tin aluminum zinc oxide (SnAlZnO), binary metal oxide such as indium zinc oxide (InZnO), tin zinc oxide (SnZnO), aluminum zinc oxide (AlZnO), zinc magnesium oxide (ZnMgO), tin magnesium oxide (SnMgO), indium magnesium oxide (InMgO), indium gallium oxide (InGaO), indium oxide (InO), tin oxide (SnO), zinc oxide (ZnO), indium gallium zinc oxide (IGZO) and the like. The active layer can be composed of a double layer including molybdenum titanium (MoTi).

The active layer includes the first to third drain areas DA1 to DA3, the first to third source areas SA1 to SA3, which include p-type or n-type impurities, and the first to third channels CH1 to CH3 formed between the first to third source areas SA1 to SA3 and the first to third drain areas DA1 to DA3 respectively.

A second electrode layer is disposed on the active layer. A gate insulating layer GI can be interposed between the active layer and the second electrode layer. The gate insulating layer GI can be formed of silicon oxide (SiOx), silicon nitride (SiNx), or multiple layers thereof.

The second electrode layer can include the gate electrodes GE1, GE2, and GE3, the source electrodes SE1, SE2, and SE3, and the drain electrodes DE1, DE2, and DE3. The gate electrodes GE1, GE2, and GE3 can be disposed to overlap on the corresponding channels CH1, CH2, and CH3 of the active layer, respectively. At least some (GE1, GE3) of the gate electrodes GE1, GE2, and GE3 can be integrally formed with the wirings GL1 and GL2 electrically connected to the corresponding gate electrodes GE1 and GE3 and constitute one pattern.

The second electrode layer can further include the upper electrode UE of the storage capacitor Cst. The upper electrode UE is formed such that at least one region of the upper electrode UE is formed to cover the bottom electrode BE. Since charges corresponding to a potential difference between the upper electrode UE and the bottom electrode BE are stored between the two electrodes, the upper electrode UE and the bottom electrode BE can operate as the storage capacitor Cst. In various embodiments, the storage capacitor Cst can further include a middle electrode. When the storage capacitor Cst is formed to include the middle electrode, it is possible to further increase the capacitor capacity in a limited area. The upper electrode UE and the middle electrode constitute a first capacitor, and the bottom electrode BE and the middle electrode constitute a second capacitor. The first and second capacitors are connected in parallel. As a result, the storage capacitor Cst has a value obtained by summing the capacitor capacity of the first capacitor and the capacitor capacity of the second capacitor, and thus the capacity of the storage capacitor Cst can be increased. Details on this will be described later.

The upper electrode UE can be electrically connected to the second source electrode SE2 of the driving transistor DT through the fifth contact hole CT5. Also, the upper electrode UE can be electrically connected to the anode electrode AE of the light emitting device LD through the first via hole VIA1.

The above-described storage capacitor Cst is connected to the second gate electrode GE2 of the driving transistor DT through the bottom electrode BE. The cathode electrode CE of the light emitting device LD can be formed on the driving transistor DT. In this case, an electric field can be formed between the cathode electrode CE and the second gate electrode GE2 of the driving transistor DT. This can reduce the charging rate of the storage capacitor Cst electrically connected to the second gate electrode GE2. In other words, a parasitic capacitor can be formed which has the second gate electrode GE2 as one electrode thereof and the cathode electrode CE as the other electrode thereof. As described in the embodiment, when the second gate electrode GE2 is electrically connected to the bottom electrode BE instead of the upper electrode UE of the storage capacitor Cst, an electrical path from the parasitic capacitor to the storage capacitor Cst becomes relatively longer, so that the effect of the parasitic capacitor can be reduced. Also, since the bottom electrode BE of the storage capacitor Cst is formed on the substrate of the display panel 50, an electric field between the second gate electrode GE2 and the cathode electrode CE is prevented from being formed, thereby removing the parasitic capacitor.

The second electrode layer can further include the bridge pattern BRP. The bridge pattern BRP can electrically connect the third source electrode SE3 of the sensing transistor SST and the sensing line SL. The second electrode layer can further include the repair pattern RP.

The first and second electrode layers can be formed of any one selected from the group consisting of molybdenum (Mo), aluminum (Al), chromium (Cr), gold (Au), titanium (Ti), nickel (Ni), neodymium (Nd), and copper (Cu) or of an alloy thereof. Also, the first and second electrode layers can be formed as multiple layers made of any one selected from the group consisting of molybdenum (Mo), aluminum (Al), chromium (Cr), gold (Au), titanium (Ti), nickel (Ni), neodymium (Nd), and copper (Cu) or of an alloy thereof. For example, the first and second electrode layers can be a double layer of molybdenum/aluminum-neodymium or molybdenum/aluminum.

The pixel circuit layer can be covered by a passivation layer PAS. The passivation layer PAS can cover the second electrode layer and exposed areas of the buffer layer BUF and the active layer which are not covered by the second electrode layer. The passivation layer PAS is an insulating layer for protecting the devices thereunder, and can be formed of silicon oxide (SiOx), silicon nitride (SiNx), or multiple layers thereof. In various embodiments, the passivation layer PAS can be omitted.

An overcoat layer OC can be formed on the passivation layer PAS. The overcoat layer OC can be a planarization layer for reducing a step difference in the structure thereunder and can be composed of organic matter such as polyimide, benzocyclobutene series resin, acrylate, etc.

In the embodiment, a color filter can be formed between the passivation layer PAS and the overcoat layer OC. The color filter can be formed in the light emitting area EA. The color filter is a wavelength-selective optical filter that transmits light in a specific wavelength band and blocks light in another specific wavelength band, and thus, selectively transmits incident light only in a partial wavelength band. The color filter can be composed of a photosensitive resin including colorant such as pigment, dye, etc. Light which has passed through the color filter in the light emitting area EA can have any one of red, green, and blue colors. When the pixel PX represents a white color, the color filter can be omitted for the corresponding pixel PX.

Although it has been described above that the color filter is formed between the passivation layer PAS and the overcoat layer OC, the present embodiment is not limited thereto. For example, when the light emitting device LD is a top emission type, the color filter can be formed on a below-described upper layer of the light emitting device layer.

The light emitting device layer is formed on the overcoat layer OC and includes the light emitting devices LD. The light emitting device LD includes the anode electrode AE, the emission material layer EML, and the cathode electrode CE.

At least one of the anode electrode AE and the cathode electrode CE can be a transmissive electrode and at least the other can be a reflective electrode. For example, when the light emitting device LD is a back emission type, the anode electrode AE can be a transmissive electrode, and the cathode electrode CE can be a reflective electrode. Conversely, when the light emitting device LD is a top emission type, the anode electrode AE can be a reflective electrode, and the cathode electrode CE can be a transmissive electrode. In another embodiment, when the light emitting device LD is a double-sided emission type, both the anode electrode AE and the cathode electrode CE can be transmissive electrodes. Hereinafter, a detailed configuration of the light emitting device LD will be described by taking an example in which the light emitting device LD is a back emission type.

The anode electrode AE is formed on the overcoat layer OC. The anode electrode AE is electrically connected to the upper electrode UE of the storage capacitor Cst through the first via hole VIA1 which passes through the overcoat layer OC and the passivation layer PAS. The anode electrode AE can be electrically connected to the second drain electrode DE2 of the driving transistor DT via the storage capacitor Cst. As described above, when the first via hole VIA1 is formed to contact the upper electrode UE of the storage capacitor Cst, which has a relatively greater area than those of other electrodes, the effect due to the step difference around the first via hole VIA1 can be reduced.

The anode electrode AE can be formed of a transparent conductive material such as indium tin oxide (ITO), indium zinc oxide (IZO), or zinc oxide (ZnO). When the anode electrode AE is a reflective electrode, the anode electrode AE can include a reflective layer. The reflective layer can be formed of aluminum (Al), copper (Cu), silver (Ag), nickel (Ni), or an alloy thereof. In the embodiment, the reflective layer can be made of a silver/palladium/copper alloy (APC).

The bank layer is formed on the anode electrode AE in the non-emitting area NEA. However, the emission material layer EML is formed on the anode electrode AE in direct contact with the anode electrode AE in the light emitting area EA. That is, the bank layer has a half-bank structure that covers the non-emitting area NEA and does not cover the light-emitting area EA.

For example, according to a structure in which the bank layer is disposed in the entire area of the substrate SUB, which includes the light emitting area EA and the non-emitting area NEA, manufacturing cost increases and a total opening ratio of the display panel 50 is reduced. Conversely, according to a full bank-less structure, color mixing can occur in which lights which have different colors and are output from one pixel PX and another adjacent pixel PX respectively are mixed with each other in the light emitting area EA and output. Accordingly, the present invention is characterized in that the bank layer has a half-bank structure that covers the non-emitting area NEA but does not cover the light-emitting area EA.

Specifically, the bank layer is not disposed in the pixel column direction of the light emitting area EA in which a plurality of the pixels PX are arranged in a row, and the bank layer is disposed at the lower portion of the light emitting area EA in a column direction of the non-emitting area NEA in which the pixel circuit layer is disposed. Repeatedly, the bank layer is not disposed in the pixel column direction of the light emitting area EA under the non-emitting area NEA, and the bank layer is disposed at the lower portion of the light emitting area EA in a column direction of the non-emitting area NEA in which the pixel circuit layer is disposed. As a result, the bank layer can be implemented in the form of a stripe on the display device 1.

The emission material layer EML is widely formed in the light emitting area EA and the non-emitting area NEA. In the light emitting area EA, the emission material layer EML is formed to cover the anode electrode AE. In the embodiment, the emission material layer EML can have a multilayer thin film structure including a light generating layer. Here, the color of light generated in the light generating layer can be white, red, blue, green, etc., but is not limited thereto.

The light generating layer can include, for example, a hole transport layer (HTL), an organic emission material layer, and an electron transport layer (ETL). The hole transport layer serves to easily transfer holes injected from the anode electrode AE to the organic emission material layer. The organic emission material layer can be formed of an organic material including phosphorescent or fluorescent material. The electron transport layer serves to easily transfer electrons injected from the cathode electrode CE to the organic emission material layer. In addition to the hole transport layer, organic emission material layer, and electron transport layer, the emission material layer EML can further include a hole injection layer (HIL), a hole blocking layer (HBL), an electron injection layer (EIL), and an electron blocking layer (EBL).

The emission material layer EML can be formed in a tandem structure of two or more stacks. In this case, each of the stacks can include a hole transport layer, an organic light emitting layer, and an electron transport layer. When the emission material layer EML can be formed in a tandem structure of two or more stacks, a charge generation layer can be formed between the stacks. The charge generation layer can include an n-type charge generation layer positioned adjacent to the lower stack and a p-type charge generation layer which is formed on the n-type charge generation layer and is positioned adjacent to the upper stack. The n-type charge generation layer injects electrons into the lower stack, and the p-type charge generation layer injects holes into the upper stack. The n-type charge generation layer can be an organic layer obtained by doping an organic host material having electron transport capability with an alkali metal such as lithium (Li), sodium (Na), potassium (K), or cesium (Cs), or an alkaline earth metal such as magnesium (Mg), strontium (Sr), barium (Ba), or radium (Ra). The p-type charge generation layer can be an organic layer obtained by doping an organic host material having hole transport capability with a dopant.

The cathode electrode CE is formed on the emission material layer EML. The cathode electrode CE can be widely formed in the light emitting area EA and the non-emitting area NEA.

The cathode electrode CE can be made of a transparent conductive material (TCO) or a semi-transmissive conductive material such as molybdenum (Mo), tungsten (W), silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) and alloys thereof. When the cathode electrode CE is made of the semi-transmissive conductive material, a light emission efficiency can be increased due to micro cavities.

Referring to FIGS. 3A, 3B and 4, in the present embodiment, at least one portion of the anode electrode AE extends to the non-emitting area NEA in order to contact the circuit element.

In the embodiment, a light absorbing layer LA can be further included between the passivation layer PAS and the overcoat layer OC. The light absorbing layer LA can include a colorant such as pigment, dye, etc., that transmits light in a specific wavelength band and blocks light in another specific wavelength band, and thus, selectively transmits incident light only in a partial wavelength band. The light absorbing layer LA can have a structure in which at least two pigment layers are stacked, in order that the light absorbing layer absorbs light generated from the light emitting device LD. For example, the light absorbing layer LA can include a first absorbing layer LA1 including a pigment of a first color and a second absorbing layer LA2 including a pigment of a second color different from the first color. In the embodiment, the first color can be a red color, and the second color can be a blue color, but they are not limited thereto. When the absorbing layers including pigments of different colors are overlapped, a light leakage phenomenon can be effectively blocked by a luminous reflective effect (e.g., a black luminous effect).

The light absorbing layer LA is made of the same material as the color filter, and can be formed by the same process as the color filter. That is, the color filter including the pigment of the same color and the light absorbing layer LA can be formed together through a single masking process. For example, when the color filter including the pigment of the first color is formed, the first absorbing layer LA1 of the light absorbing layer LA can be formed together, and when the color filter including the pigment of the second color is formed, the second absorbing layer LA2 of the light absorbing layer LA can be formed together. Accordingly, according to the present embodiment, a light leakage phenomenon in the non-emitting area NEA can be more completely blocked without requiring a separate additional process for generating the light absorbing layer LA.

The light absorbing layer LA can be formed on the entire non-emitting area NEA. However, the present embodiment is not limited thereto, and depending on the implementation, the light absorbing layer LA can be formed on the anode electrode AE in the non-emitting area NEA. In the embodiment, when the pixel PX represents a white color, the light absorbing layer LA may not be formed in the pixel PX.

When the light absorbing layer LA is formed on the entire non-emitting area NEA, the first via hole VIA1 and the second via hole VIA2 can be formed to pass through the light absorbing layer LA. Alternatively, the light absorbing layer LA may not be formed around the first via hole VIA1 and the second via hole VIA2.

Figure 5:
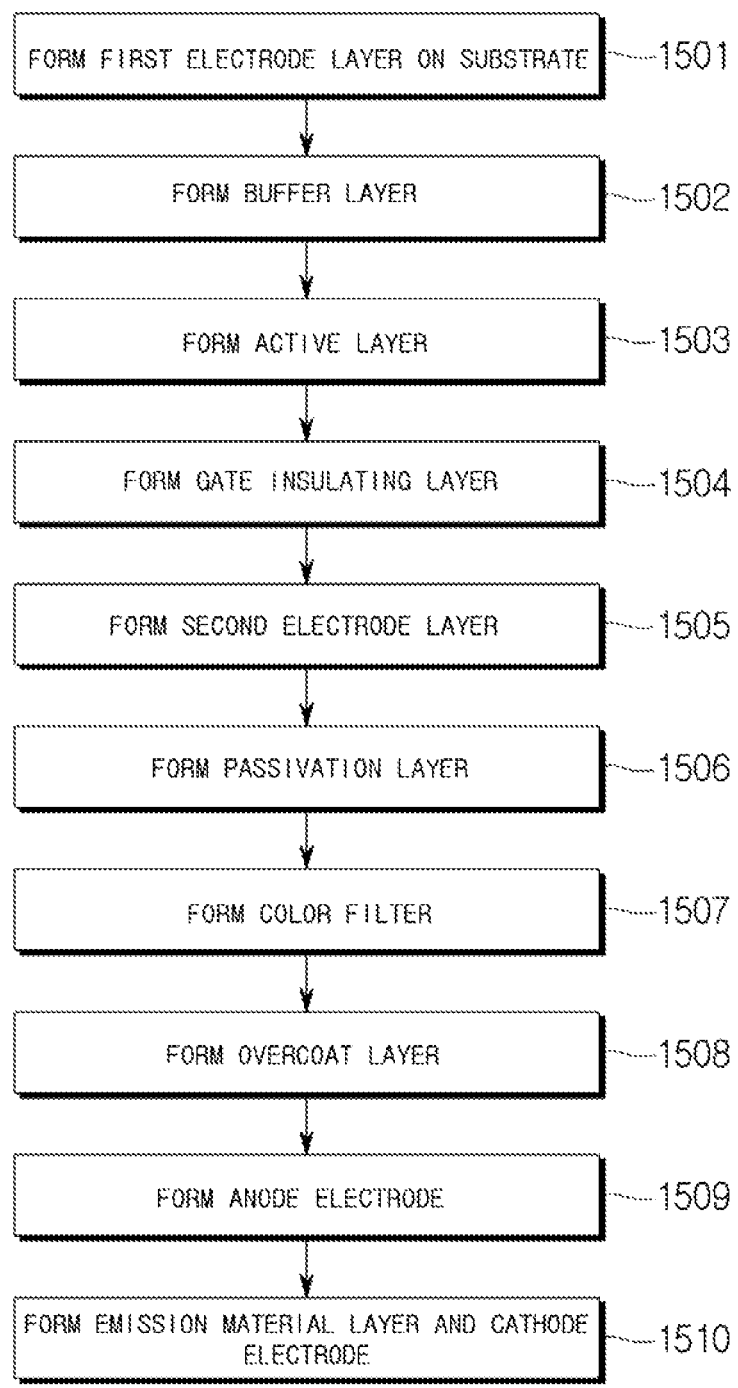
FIG. 5 is a flowchart showing a manufacturing method of a display panel according to the embodiment.

FIG. 5 is a flowchart showing a manufacturing method of the display panel according to the embodiment of the present disclosure. Particularly, FIG. 5 will be described with reference to FIGS. 3A, 3B and 4.

First, the pixel circuit layer can be formed on the substrate SUB. Specifically, the first electrode layer can be formed on the substrate SUB (1501). The first electrode layer can be formed by forming a conductive layer on the substrate SUB by using a printing process, a sputtering process, a chemical vapor deposition process, a pulse laser deposition (PLD) process, a vacuum deposition process, an atomic layer lamination process, etc., and by patterning through an etching process using a mask. Here, a first mask can be used.

Then, the buffer layer BUF can be formed on the first electrode layer (1502). The buffer layer BUF can be formed through a chemical vapor deposition process, a spin coating process, a plasma enhanced chemical vapor deposition process, a sputtering process, a vacuum deposition process, a high-density plasma-chemical vapor deposition process, a printing process, or the like.

The active layer can be formed on the buffer layer BUF (1503). For example, an amorphous silicon layer can be formed on the buffer layer BUF, and a polysilicon layer can be formed by crystallizing the amorphous silicon layer. Then, the active layer can be formed by patterning the polysilicon layer by a photolithography process or the like. Here, a second mask for the photolithography process can be used. The source areas SA1, SA2, and SA3, the drain areas DA1, DA2, and DA3, and the channels CH1, CH2, and CH3 can be formed by implanting impurities into the polysilicon layer constituting the active layer. Contact holes for contacting the first electrode layer and the upper layer can be further formed in the buffer layer BUF.

The gate insulating layer GI can be formed on the active layer (1504). The gate insulating layer GI can be selectively formed in a below-described area where the second electrode layer is to be formed. Specifically, the gate insulating layer GI can be formed by a photolithography process which exposes and develops the gate insulating layer GI by using a mask. Here, a third mask can be used. The active layer can be composed of a double layer including molybdenum titanium (MoTi).

The second electrode layer can be formed on the gate insulating layer GI (1505). The second electrode layer can be formed by forming a conductive layer on the substrate SUB by using a printing process, a sputtering process, a chemical vapor deposition process, a pulse laser deposition (PLD) process, a vacuum deposition process, an atomic layer lamination process, etc., and by patterning through an etching process using a mask. Here, a fourth mask can be used.

Then, the passivation layer PAS can be formed to cover the second electrode layer (1506). The color filter can be formed on the passivation layer PAS (1507). In the color filter, for example, the color filter of the first color can be patterned by using the first mask, the color filter of the second color can be patterned by using the second mask, and the color filter of the third color can be patterned by using the third mask. While the color filter is being formed, the light absorbing layer LA can be formed together. In order to form the color filter and the light absorbing layer LA, three masks corresponding to the colors respectively, that is to say, fifth to seventh masks can be used.

Then, the overcoat layer OC is formed to cover the color filter and the light absorbing layer LA (1508). The overcoat layer OC can be exposed and developed on the passivation layer PAS by using the mask. The mask can include openings corresponding to the via holes VIA1 and VIA2. Here, an eighth mask can be used.

Then, the light emitting device can be formed on the overcoat layer OC. Specifically, the anode electrode AE is patterned on the overcoat layer OC by using a ninth mask having openings corresponding to the emission areas EA (1509).

After the anode electrode AE is formed, the emission material layer EML and the cathode electrode CE are widely formed to cover the entire area of the display panel 50 (1510).

Figure 6:
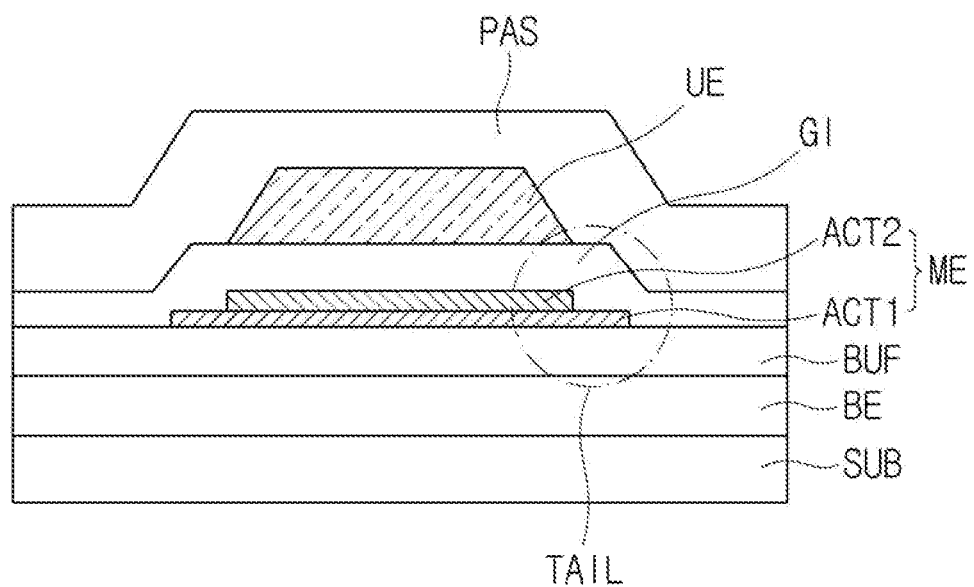
FIG. 6 shows a cross section of a storage capacitor Cst of FIG. 4 according to the embodiment.
Figure 7:
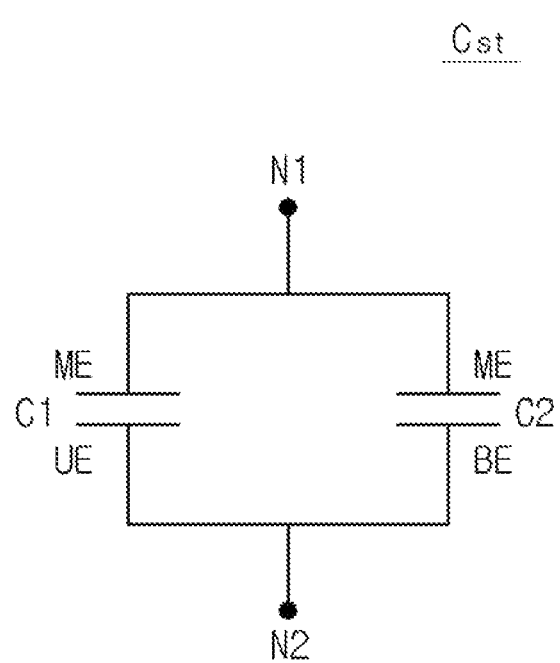
FIG. 7 shows an example of the storage capacitor Cst by a circuit symbol.

FIG. 6 shows a cross section of the storage capacitor Cst of FIG. 4 according to the embodiment. FIG. 7 shows an example of the storage capacitor Cst by a circuit symbol.

In this embodiment, the storage capacitor Cst can include the upper electrode UE, the bottom electrode BE, and the middle electrode ME.

The buffer layer BUF is interposed between the bottom electrode BE and the middle electrode ME. The gate insulating layer is interposed between the middle electrode ME and the upper electrode UE. Since the buffer layer BUF and the gate insulating layer are insulators, both the upper electrode UE and the middle electrode ME, and both the middle electrode ME and the bottom electrode BE can function as a capacitor for storing charges, respectively. The upper electrode UE and the middle electrode ME form a first capacitor C1, and the middle electrode ME and the bottom electrode BE form a second capacitor C2. The middle electrode ME is connected to the gate electrode of the driving transistor and then is connected to the first node N1 of FIG. 2. The upper electrode UE and the bottom electrode BE are electrically connected to the source node of the driving transistor and then is connected to second node N2. Since the first capacitor C1 and the second capacitor C2 are connected in parallel, the capacitance of the storage capacitor Cst is the sum of the capacitances of the first and second capacitors C1 and C2. As such, when the storage capacitor Cst is formed by using three electrodes, the capacitance can be further increased in a limited area, thereby increasing the opening ratio.

The first electrode layer disposed on the substrate SUB can constitute the bottom electrode BE of the storage capacitor Cst. The first electrode layer can include the light shielding layer.

The buffer layer BUF is disposed on the bottom electrode BE to cover the first electrode layer. The buffer layer BUF can prevent ions or impurities from diffusing from the substrate SUB and can block moisture from permeating. Also, the buffer layer BUF can improve the surface flatness of the substrate SUB. The buffer layer BUF can include inorganic matter such as oxide, nitride, etc., organic matter, or organic/inorganic composite.

The middle electrode ME is disposed on the buffer layer BUF. The middle electrode ME can be formed in the same layer as a layer in which the second channel (active layer) CH2 of FIG. 4 is formed. As described above, the active layer can be composed of a double layer including molybdenum titanium (MoTi). The middle electrode ME constituting the storage capacitor Cst can also be composed of a double layer including molybdenum titanium (MoTi).

A first active layer ACT1 can be composed of indium gallium zinc oxide (IGZO).

A second active layer ACT2 can be made of molybdenum titanium (MoTi). The second active layer ACT2 made of molybdenum titanium (MoTi) has a low contact resistance with respect to the first active layer ACT1 made of amorphous zinc oxide. Also, the second active layer ACT2 has selectivity during wet etching. The middle electrode ME is connected to the gate electrode of the driving transistor (see GE2 of FIG. 4). The gate electrode of the driving transistor has a TOP gate structure, and the gate electrode is formed on the same layer as a layer in which the upper electrode UE is formed. The middle electrode ME is connected to the gate electrode of the driving transistor, and the upper electrode UE and the middle electrode ME which constitute the gate electrode constitute different layers. Therefore, a contact hole for electrically connecting the gate electrode and the middle electrode ME in the driving transistor region is required. The second active layer ACT2 made of molybdenum titanium (MoTi) has a low contact resistance with respect to the first active layer ACT1 made of amorphous zinc oxide. Therefore, even if a contact hole connecting the gate electrode and the middle electrode ME is formed small when the middle electrode ME is composed of a double layer including molybdenum titanium (MoTi), there is no problem in reliability. The opening ratio can be increased when the contact hole is formed small. When the middle electrode ME is composed of a double layer including molybdenum titanium (MoTi), the opening ratio can be improved.

Also, the second active layer ACT2 made of molybdenum titanium (MoTi) serves to protect the first active layer ACT1 composed of indium gallium zinc oxide (IGZO). Hydrogen remaining in the passivation layer can diffuse into the first active layer ACT1 composed of indium gallium zinc oxide (IGZO). The middle electrode ME forms a channel in the driving transistor region, and when hydrogen diffuses into the channel, a threshold voltage of the driving transistor can be changed. The second active layer ACT2 made of molybdenum titanium (MoTi) blocks the diffusion of hydrogen into the first active layer ACT1. That is, the second active layer ACT2 functions as a hydrogen blocking layer of the first active layer ACT1.

The gate insulating layer GI is disposed on the middle electrode ME. The gate insulating layer GI can be formed by a photolithography process which exposes and develops the gate insulating layer GI by using a mask. Here, a third mask can be used.

The upper electrode UE is formed on the gate insulating layer GI. The upper electrode UE is formed by patterning the second electrode layer through an etching process using a mask. The second electrode layer is formed of a conductive film on the gate insulating layer GI by using a printing process, a sputtering process, a chemical vapor deposition process, a pulse laser deposition (PLD) process, a vacuum deposition process, an atomic layer lamination process, or the like.

The passivation layer is disposed on the upper electrode UE to cover the upper electrode UE.

As described above, in order to increase the opening ratio, the middle electrode ME is composed of a double layer which includes the first active layer ACT1 composed of indium gallium zinc oxide (IGZO) and the second active layer ACT2 made of molybdenum titanium (MoTi).

In this structure, the inventors of the present disclosure have found the following limitations.

It has been confirmed that TAIL is generated in the first active layer ACT1 when the middle electrode ME composed of a double layer is formed. When a TAIL-shaped pattern (hereinafter, TAIL pattern) is formed in a channel region of the driving transistor at the end of the first active layer ACT1 as indicated by a dotted circle in FIG. 6, a HUMP phenomenon in which the device characteristics of the driving transistor are deteriorated may occur. The HUMP phenomenon means that, in a section in which the magnitude of a drain current increases linearly in proportion to the magnitude of a gate voltage of the driving transistor, the drain current increases linearly and then abnormally jumps.

Also, the TAIL pattern of the first active layer ACT1 increases an area where a pixel circuit element layer is formed, thereby reducing the opening ratio. Also, the TAIL pattern of the first active layer ACT1 reduces the success rate of repair for cutting the cells within the pixel.

The inventors of the present disclosure have invented a new process of preventing the formation of the TAIL pattern of the first active layer ACT1. Hereinafter, the process of preventing the formation of the TAIL pattern will be described with reference to FIGS. 8 to 12.

FIGS. 8 to 12 are views for describing a detailed process for steps of forming the active layer. "Cst" denotes a region where the storage capacitor Cst is formed, and "DT" denotes a region where the driving transistor is formed.

Figure 8:
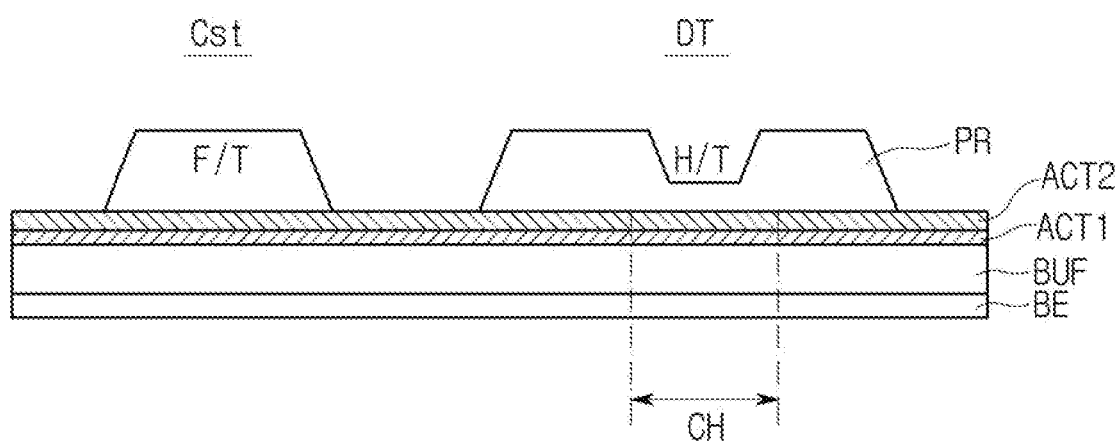
FIGS. 8 to 12 are views for describing a detailed process including the steps of forming an active layer according to an embodiment of the present disclosure.

FIG. 8 shows that the first active layer ACT1 is deposited, the second active layer ACT2 is deposited on the first active layer ACT1, a photoresist PR material is applied on the active layer in which the first active layer ACT1 and the second active layer ACT2 are sequentially deposited, and a photoresist PR pattern is formed through a halftone mask. The photoresist PR pattern is formed by a halftone H/T at a position corresponding to the region where the channel (CH) of the driving transistor is formed. "FIT" in the drawing represents a full tone.

Figure 9:
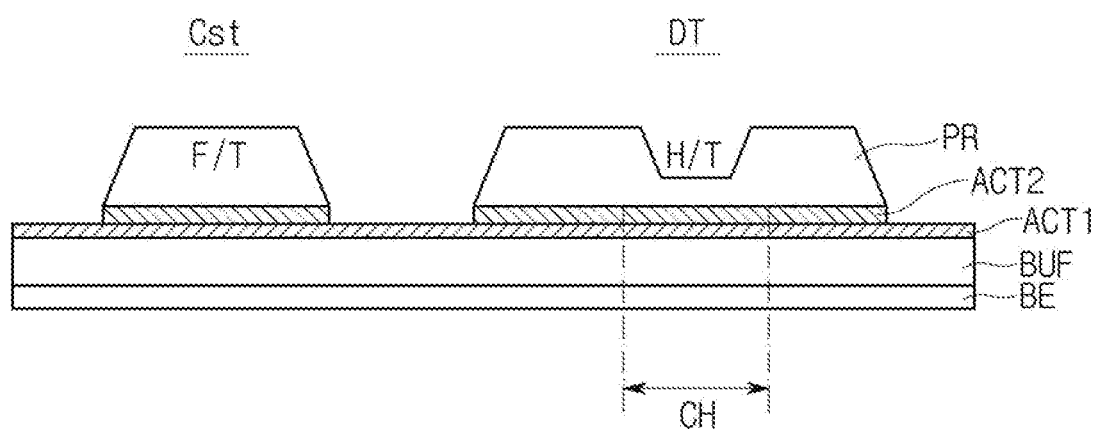

FIG. 9 shows a first patterning step and shows the first patterning step of the second active layer ACT2. The second active layer ACT2 is first patterned to correspond to the photoresist PR pattern. It is preferable that the first patterning of the second active layer ACT2 is performed by a dry etching method. This is because, in the first patterning step of the second active layer ACT2, the first active layer ACT1 disposed under the second active layer ACT2 should not be etched. Therefore, it is desirable to use the dry etching method which is capable of etching only a desired portion, has good accuracy and enables fine patterning. The dry etching has anisotropic properties having different etching rates in the horizontal and vertical directions.

Figure 10:
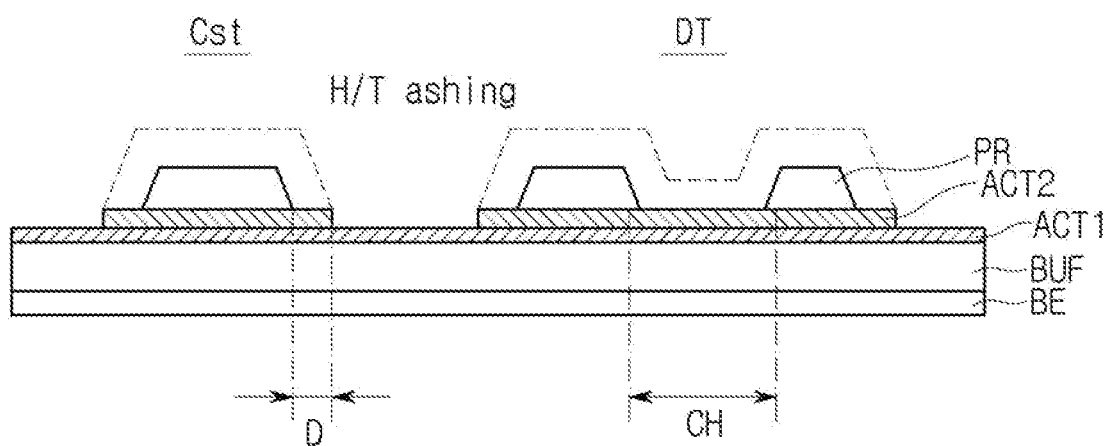

FIG. 10 shows a halftone H/T ashing step of removing a portion of the photoresist PR. Through the halftone H/T ashing, a portion of the photoresist PR is removed and the thickness of the photoresist PR is reduced. It is desirable that a portion of the photoresist PR is removed to the extent that the photoresist PR pattern formed by the halftone H/T is removed to expose a region where the channel CH of the driving transistor is formed. The side width of the photoresist PR covering the second active layer ACT2 is reduced through the halftone H/T ashing, and as a result, a portion of the second active layer ACT2 of the storage capacitor Cst region is exposed together by as much as D.

Figure 11:
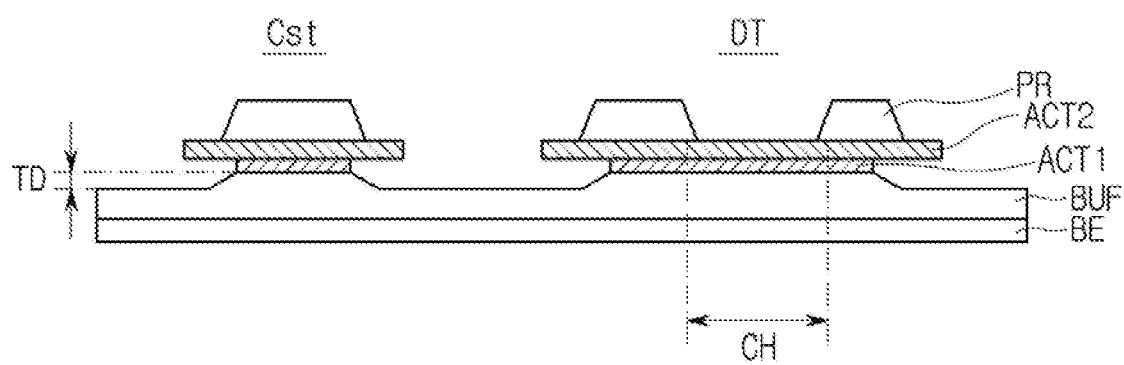

FIG. 11 shows a second patterning step and shows a step of etching the first active layer ACT1. In the second patterning step, the etching may be excessively performed such that a portion of the buffer layer disposed under the first active layer ACT1 is etched together. It is preferable that wet etching is performed on the first active layer ACT1. It is preferable to select a material which selectively dissolves only non-metallic materials, as an etching solution. The wet etching has a high etching rate and has isotropic properties having the same etching rate in the horizontal and vertical directions. Therefore, even the bottom of the photoresist PR can be etched. When the first active layer ACT1 is patterned by a wet etching method, even the bottoms of the photoresist PR and the second active layer ACT2 can be etched as shown in FIG. 11. As a result, the buffer layer BUF has a thickness difference TD. Specifically, in the buffer layer BUF, the thickness of the region covered by the first active layer ACT1 is greater than the thickness of the exposed region. The channel CH region of the driving transistor is not etched because the etching solution is blocked by the second active layer ACT2.

Figure 12:
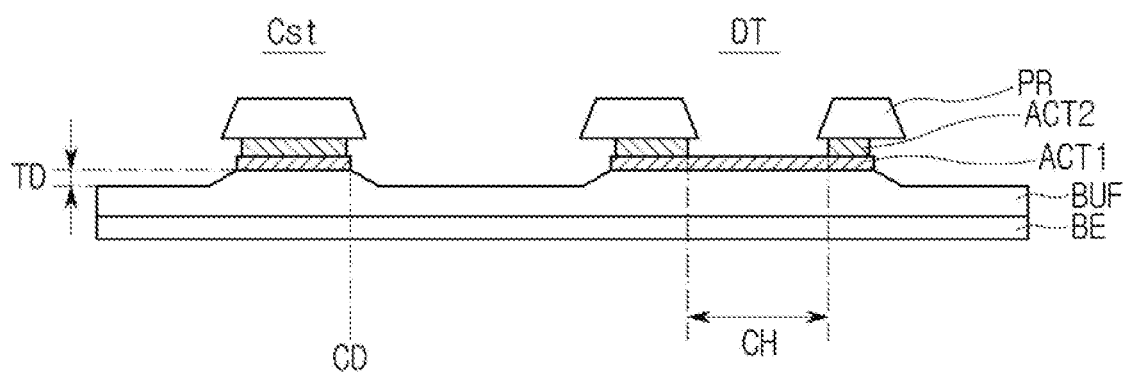

FIG. 12 shows a third patterning step and shows the second patterning step of the second active layer ACT2, that is, additionally etching the second active layer ACT2. In the second patterning step, the end of the second active layer ACT2 is removed. It is preferable that the wet etching is performed on the second patterning of the second active layer ACT2. This is because, unlike the first patterning step, the third patterning step requires isotropic etching having a high etching rate. In the third patterning step, it is preferable to select a material which dissolves both a metallic material such as molybdenum titanium (MoTi) and a non-metallic material, as an etching solution.

When the active layer is formed by the above-described process, it is possible to prevent the problem described with reference to FIG. 6, that is, the formation of the TAIL pattern of the first active layer ACT1. As a result of forming the active layer by the described process, it has been confirmed that a critical dimension (CD) value of the TAIL pattern of the first active layer ACT1 is improved from 1.6 micrometers to 0 micrometer.

Figure 13:
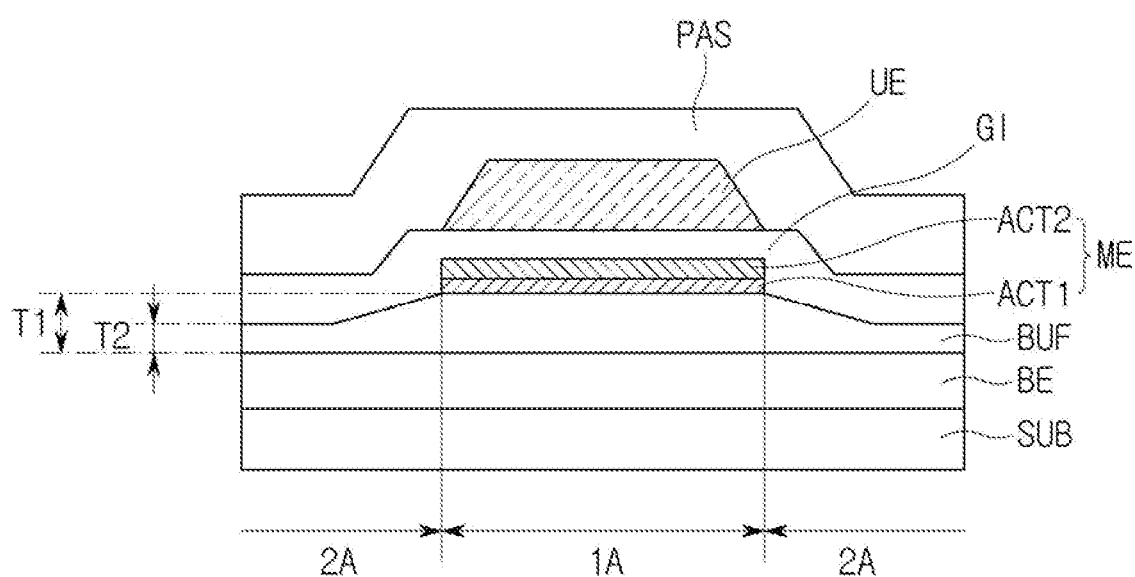
FIG. 13 shows another embodiment of FIG. 6 and shows a cross section of the storage capacitor Cst formed by a manufacturing process of FIGS. 7 to 12.

FIG. 13 shows another embodiment of FIG. 6 and shows a cross section of the storage capacitor Cst formed by the manufacturing process of FIGS. 7 to 12.

The storage capacitor Cst includes the bottom electrode BE on the substrate SUB, the buffer layer BUF disposed on the bottom electrode, the middle electrode ME covering a portion of the buffer layer BUF, the gate insulating layer GI covering the middle electrode ME and the buffer layer BUF, and the upper electrode UE covering a portion of the gate insulating layer GI.

The middle electrode ME can be composed of a double layer. The middle electrode ME can include the first active layer ACT1 composed of indium gallium zinc oxide (IGZO) and the second active layer ACT2 made of molybdenum titanium (MoTi).

The buffer layer BUF can be divided into a first area 1A and a second area 2A. The first area 1A is covered by the middle electrode ME, and the second area A2 is exposed and is in contact with the gate insulating layer GI. A thickness T1 of the first area 1A is greater than a thickness T2 of the second area 2A. The buffer layer BUF having such a shape is a result of the second patterning step described with reference to FIG. 11. As described in FIG. 7, the bottom electrode BE and the upper electrode UE are connected to each other at the second node N2 and are connected to the anode electrode of the light emitting device. In order to connect the bottom electrode BE and the upper electrode UE to each other, a hole must be formed in the buffer layer BUF. In the display panel according to the embodiment of FIG. 13, the thickness of the second area 2A in which the hole is formed is as thin as T2. This makes it easier to form, in a subsequent process, the hole for connecting the bottom electrode BE and the upper electrode UE to each other in the buffer layer BUF.

As described above, the display panel and the method for manufacturing the same according to the embodiment proposes a storage capacitor structure capable of increasing the capacitance of the storage capacitor with respect to the area occupied by the pixel circuit layer, so that the opening ratio can be improved. Also, any one electrode constituting the storage capacitor is composed of a double layer including indium gallium zinc oxide (IGZO) and molybdenum titanium (MoTi), so that the opening ratio can be enhanced. Also, it is possible to further improve the opening ratio by preventing the formation of the TAIL pattern of indium gallium zinc oxide (IGZO), which reduces the opening ratio in the electrode composed of a double layer including indium gallium zinc oxide (IGZO) and molybdenum titanium (MoTi). Also, by preventing the formation of the TAIL pattern of indium gallium zinc oxide (IGZO), it is possible to improve the success rate of repair for cutting the cells within the pixel. At the same time, it is possible to remove the influential factor of the HUMP phenomenon in which the device characteristics of the driving transistor are deteriorated.

Those skilled in the art from the above description will be able to see that various changes and modifications can be made without departing from the technical spirit of the present invention. Accordingly, the technical scope of the present invention should not be limited to the contents described in the detailed description of the specification, but should be defined by the claims.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A manufacturing method of a display panel including a light emitting device and a pixel circuit which drives the light emitting device, the manufacturing method comprising:
    forming the pixel circuit on a substrate; and
    forming the light emitting device on the pixel circuit,
    wherein the forming the pixel circuit comprises:
        forming a first electrode layer on the substrate;
        forming a buffer layer on the first electrode layer; and
        forming an active layer on the buffer layer,
    wherein the forming the active layer comprises:
        depositing a first active layer and depositing a second active layer on the first active layer;
        a first patterning step including applying a photoresist material on the second active layer, forming a photoresist pattern through a halftone mask, and first etching the second active layer;
        a halftone ashing step of exposing a portion of the first pattern second active layer; and
        a second patterning step of etching the first active layer,
    wherein, in the second patterning step, the etching is excessively performed so that a portion of the buffer layer disposed under the first active layer is etched together.

2. The manufacturing method of claim 1, wherein the forming the active layer further comprises a third patterning step of additionally etching the second active layer.

3. The manufacturing method of claim 2, wherein the third patterning step comprises wet etching.

4. The manufacturing method of claim 1, wherein the first patterning step comprises dry etching.

5. The manufacturing method of claim 1, wherein the second patterning step comprises wet etching.

6. The manufacturing method of claim 1, wherein the first active layer is composed of indium gallium zinc oxide (IGZO), and
  wherein the second active layer is made of molybdenum titanium (MoTi).

\* \* \* \* \*